(12) United States Patent
Ma et al.

(10) Patent No.: US 10,497,718 B2
(45) Date of Patent: Dec. 3, 2019

(54) SILICON-ON-INSULATOR STRUCTURE HAVING BIPOLAR STRESS, AND MANUFACTURING METHOD THEREFOR

(71) Applicant: Shanghai Huali Microelectronics Corporation, Shanghai (CN)

(72) Inventors: Yanfei Ma, Shanghai (CN); Changfeng Wang, Shanghai (CN); Duanquan Liao, Shanghai (CN)

(*) Notice: Subject to any disclaimer, the term of this patent is extended or adjusted under 35 U.S.C. 154(b) by 0 days.

(21) Appl. No.: 15/981,921

(22) Filed: May 17, 2018

(65) Prior Publication Data

US 2019/0304998 A1 Oct. 3, 2019

(30) Foreign Application Priority Data

Mar. 30, 2018 (CN) .......................... 2018 1 0286263

(51) Int. Cl.
| | |
|---|---|
| *H01L 27/12* | (2006.01) |
| *H01L 21/762* | (2006.01) |
| *H01L 29/161* | (2006.01) |
| *H01L 21/28* | (2006.01) |
| *H01L 29/72* | (2006.01) |
| *H01L 21/02* | (2006.01) |

(52) U.S. Cl.
CPC .... *H01L 27/1203* (2013.01); *H01L 21/02532* (2013.01); *H01L 21/28176* (2013.01); *H01L 21/76229* (2013.01); *H01L 29/161* (2013.01); *H01L 29/72* (2013.01)

(58) Field of Classification Search
CPC . H01L 29/161; H01L 29/72; H01L 21/02532; H01L 21/28176; H01L 21/76229; H01L 27/1203

See application file for complete search history.

(56) References Cited

U.S. PATENT DOCUMENTS

| | | | | |
|---|---|---|---|---|
| 8,617,968 B1 * | 12/2013 | Cheng | ............. | H01L 21/823807 257/18 |
| 2012/0068267 A1 * | 3/2012 | Bedell | ............. | H01L 21/823807 257/350 |

* cited by examiner

*Primary Examiner* — Matthew L Reames
(74) *Attorney, Agent, or Firm* — Kilpatrick Townsend & Stockton, LLP

(57) ABSTRACT

Provided are a silicon-on-insulator structure having bipolar stress and a manufacturing method therefor. The manufacturing method comprises providing a composite substrate, wherein the composite substrate has a silicon substrate layer, a buried oxide layer and a silicon-on-insulator layer sequentially from bottom to top, epitaxially growing a silicon germanium layer on an upper surface of the silicon-on-insulator layer; depositing a hard mask layer to cover a portion of the silicon germanium layer corresponding to an N-type MOS transistor region; depositing a surface oxide layer to cover the silicon germanium layer and the hard mask layer; performing a high temperature annealing treatment so that a portion of the silicon-on-insulator layer corresponding to a P-type MOS transistor region is converted into a silicon-germanium-on-insulator layer, and the portion corresponding to the N-type MOS transistor region is converted into a tensile stress silicon-on-insulator layer.

6 Claims, 4 Drawing Sheets

SILICON-ON-INSULATOR STRUCTURE HAVING BIPOLAR STRESS, AND MANUFACTURING METHOD THEREFOR

CROSS-REFERENCES TO RELATED APPLICATIONS

The present application claims priority to Chinese Patent Application No. 201810286263.1, filed on Mar. 30, 2018, entitled "SILICON-ON-INSULATOR STRUCTURE HAVING BIPOLAR STRESS, AND MANUFACTURING METHOD THEREFOR", which is incorporated by reference herein for all purposes.

TECHNICAL FIELD

The present disclosure relates to semiconductor elements, and particularly to a silicon-on-insulator structure containing bipolar stress and a manufacturing method therefor.

BACKGROUND OF THE INVENTION

Since the invention of integrated circuits by Dr. Jack Kilby of Texas Instruments in early years, scientists and engineers have made numerous inventions and improvements in semiconductor devices and processes. Over 50 years, the dimension of semiconductors have been significantly reduced, which translates into an increasing processing speed and decreasing power consumption. To date, the development of semiconductors has largely followed Moore's Law, which roughly states that the number of transistors in dense integrated circuits doubles about every two years. At present, semiconductor processes are developing toward below 20 nm, and some companies are embarking on 14 nm processes. Just to provide a reference herein, a silicon atom is about 0.2 nm, which means that the distance between two separate components manufactured by a 20 nm process is about only one hundred silicon atoms.

Semiconductor device manufacturing has therefore become increasingly challenging and advancing toward the physically possible limit. One of the recent developments in the semiconductor technology has been the use of silicon-on-insulators (SOI) in semiconductor manufacturing. However, the electrical characteristics of the semiconductor devices of the current silicon-on-insulator structure still need to be debugged. Therefore, there is an urgent need for a method for improving the electrical characteristics of a silicon-on-insulator MOS transistor device, as well as a silicon-on-insulator structure having better electrical characteristics.

BRIEF SUMMARY OF THE INVENTION

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

As stated above, in order to provide a silicon-on-insulator MOS transistor device having better electrical characteristics, the present disclosure provides a manufacturing method for a silicon-on-insulator structure having bipolar stress. The method comprises: providing a composite substrate, wherein the composite substrate has a silicon substrate layer, a buried oxide layer and a silicon-on-insulator layer sequentially from bottom to top; epitaxially growing a silicon germanium layer on an upper surface of the silicon-on-insulator layer; depositing a hard mask layer to cover a portion of the silicon germanium layer corresponding to an N-type MOS transistor region; depositing a surface oxide layer to cover the silicon germanium layer and the hard mask layer; performing a high temperature annealing treatment so that a portion of the silicon-on-insulator layer corresponding to a P-type MOS transistor region is converted into a silicon-germanium-on-insulator layer, and the portion corresponding to the N-type MOS transistor region is converted into a tensile stress silicon-on-insulator layer; and removing the excess silicon germanium layer, hard mask layer and surface oxide layer on the surfaces of the silicon-germanium-on-insulator layer and the tensile stress silicon-on-insulator layer.

In one embodiment, the above-mentioned high temperature annealing treatment has a temperature range of 800-1300° C. and a time range of 0.5-3 hours.

In one embodiment, the above-mentioned step of depositing a hard mask layer further comprises: forming the above-mentioned hard mask layer using a contact-etching stop-layer process by means of low-pressure chemical vapour deposition or plasma enhanced chemical vapour deposition.

In one embodiment, the above-mentioned removing step further comprises: removing the excess silicon germanium layer, hard mask layer and surface oxide layer by using wet processes, wherein the surface oxide layer is removed using diluted hydrofluoric acid; the hard mask layer is removed using phosphoric acid; and the silicon germanium layer is removed using a mixed solution of nitric acid, hydrofluoric acid, acetic acid and water.

In one embodiment, the mixed solution further comprises: the concentration of the nitric acid is 70%; the concentration of the hydrofluoric acid is 49%; the concentration of the acetic acid is 99.9%; and the ratio of the nitric acid, the hydrofluoric acid, the acetic acid and the water is 40:1:2:57.

In one embodiment, the above-mentioned method further comprises: forming an STI shallow trench isolation in abutting portions of the silicon-germanium-on-insulator layer and the tensile stress silicon-on-insulator layer.

The present disclosure further provides a silicon-on-insulator structure having bipolar stress, wherein the silicon-on-insulator structure is formed on a buried oxide layer, the buried oxide layer is formed on a silicon substrate layer, and the silicon-on-insulator structure, the buried oxide layer and the silicon substrate layer constitute a composite substrate of a transistor device, wherein the silicon-on-insulator structure corresponding to a P-type MOS transistor region is a silicon-germanium-on-insulator structure, the silicon-germanium-on-insulator structure having compressive stress, and the silicon-on-insulator structure corresponding to an N-type MOS transistor region is a tensile stress silicon-on-insulator structure.

In one embodiment, the silicon-on-insulator structure further includes an STI shallow trench isolation structure, the STI shallow trench isolation structure being located in abutting portions of the silicon-germanium-on-insulator structure and the tensile stress silicon-on-insulator structure, wherein the abutting portions of the silicon-germanium-on-insulator structure and the tensile stress silicon-on-insulator structure which abut the STI shallow trench isolation structure are uniform in structure.

The present disclosure further provides a silicon-on-insulator structure having bipolar stress, wherein the siliconon-insulator structure is manufactured using the above-mentioned manufacturing method.

The present disclosure further provides a transistor, wherein the transistor comprises the silicon-on-insulator structure having bipolar stress as mentioned above.

In the embodiments provided in the present disclosure, there is a silicon-germanium-on-insulator layer corresponding to the PMOS transistor region, which improves the hole mobility of the PMOS transistor, and there is a tensile stress silicon-on-insulator layer corresponding to the NMOS transistor region, which improves the hole mobility of the NMOS transistor, thereby improving the electrical characteristics of the transistor, and the preparation method provided in the present disclosure has a simple process and a strong operability.

DETAILED DESCRIPTION OF THE INVENTION

Figure 1:
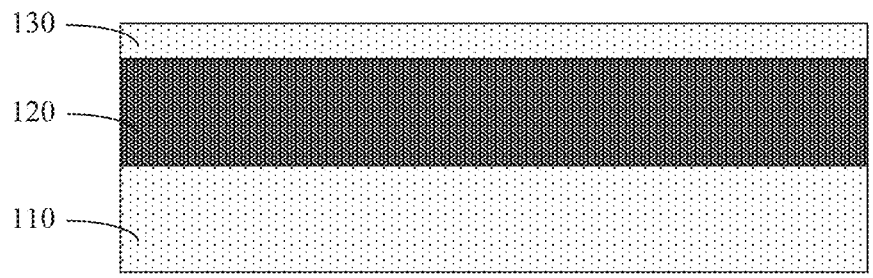
FIGS. 1-8 show schematic structural diagrams of a semiconductor manufactured according to an embodiment of a manufacturing method provided in the present disclosure.

The present disclosure relates to a semiconductor process and device. The embodiment of the present disclosure provides a silicon-on-insulator structure, wherein the silicon-on-insulator structure has bipolar stress, and a silicon-on-insulator layer corresponding to an NMOS region has a tensile stress, and a silicon-on-insulator structure corresponding to a PMOS region is a silicon-germanium-on-insulator layer, which has compressive stress. The present disclosure also provides other embodiments.

The reader is cautioned as to all files and documents which are filed at the same time as this specification and which are open for the public to consult, and the contents of all such files and documents are incorporated herein by reference. Unless directly stated otherwise, all features disclosed in this specification (including any appended claims, the abstract, and the accompanying drawings) may be replaced by alternative features serving the same, equivalent, or similar purpose. Therefore, unless expressly stated otherwise, each feature disclosed is only one example of a group of equivalent or similar features.

Furthermore, an apparatus that is not expressly indicated in the claims as being used for performing a particular function, or any component as being used for performing a step of a particular function, should not be construed as a means or step provision as specified in 35 USC Section 112, Paragraph 6. In particular, the use of "step of . . . " or "action of . . . " in the claims herein does not indicate relating to the specifications in 35 USC § 112, Paragraph 6.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . ", "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

As stated above, semiconductor device manufacturing has become increasingly challenging and advancing toward the physically possible limit. As the device structure continues to decrease in size and the process continues to shrink, thin gate oxide layers and short channels required thereby will make the device vulnerable to electric leakage and have a low performance. One of the recent developments in semiconductor technology has been the use of silicon-on-insulator (SOI) in semiconductor manufacturing. Compared to conventional silicon devices, the thickness of a top silicon film in an ultra-thin body Fully Depleted SOI (FDSOI) structure is much smaller than the width of a channel depletion region, thereby reducing the number of shared charges between a source-drain depletion region and the channel depletion region and effectively inhibiting short channel effects, so that the ultra-thin body FDSOI is widely recognized by the industry in the application of nano-structured devices. However, the electrical characteristics of the semiconductor devices of the current silicon-on-insulator structure still need to be debugged. The present disclosure provides a manufacturing method for a silicon-on-insulator semiconductor device, which has simple steps and manufactures devices having good electrical characteristics. In one embodiment, the present disclosure is implemented according to the steps described below.

FIGS. 1-8 show simplified diagrams illustrating a process procedure for providing a silicon-on-insulator structure according to an embodiment of the present disclosure. These diagrams provide examples only and should not unduly limit the scope of the claims.

As shown in FIG. 1, a composite substrate used in the present disclosure is firstly provided, and the composite substrate has a silicon substrate layer 110, a buried oxide layer 120 and a silicon-on-insulator layer 130 sequentially from bottom to top. The main function of the silicon substrate layer 110 is to provide mechanical support for the upper two layers. The buried oxide layer 120 is commonly referred to as a BOX (Buried OXide) layer. The buried oxide layer 120 separates the active silicon layer from the silicon substrate layer, therefore, a large-scale PN junction is dielectrically isolated, and furthermore, the thickness of the silicon-on-insulator layer 130 is much smaller than the width of a channel depletion region, thereby reducing the number of shared charges between the source-drain depletion region and the channel depletion region and effectively inhibiting short channel effects. The above-mentioned composite substrate can be manufactured according to the existing or future SOI wafer manufacturing technology, including but not limited to Smart Cut and other processes.

Figure 2:
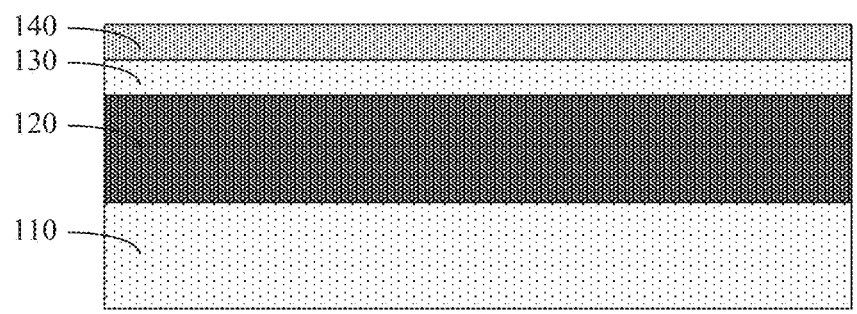

Subsequently, a silicon germanium layer 140 is epitaxially grown on the silicon-on-insulator layer 130, and FIG. 2 shows a structural schematic diagram of the epitaxial growth of a silicon germanium layer 140. Compared to a silicon germanium material, a silicon material has a smaller lattice constant, and due to lattice mismatch, the lattice is improved from bottom to top in the silicon material, thereby introducing biaxial tensile stress into silicon. At the same time, the silicon germanium layer 140 provides a source of germanium ions for subsequent processes.

After the silicon germanium layer 140 is formed, it is necessary to define the NMOS transistor region and PMOS transistor region of the semiconductor device in a patterned manner using a mask layer (usually a patterned photoresist). The above patterning process may include photoresist coating (for example, spin coating), soft baking, photomask alignment, exposure, post-exposure baking, photoresist development, rinsing, drying (for example, hard baking), other suitable processes, and/or combinations thereof.

Figure 3:
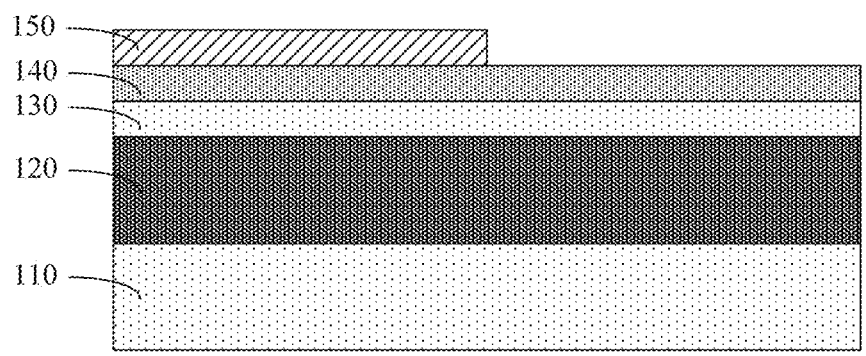

As shown in FIG. 3, for the defined NMOS transistor region, a hard mask layer 150 is deposited to cover the silicon germanium layer 140. The deposition described above may use low-pressure chemical vapour deposition (LPCVD) or plasma enhanced chemical vapour deposition (PECVD) of the contact-etching stop-layer (CESL) techniques to form the hard mask layer 150. In general, the material of the hard mask layer 150 includes but is not limited to silicon nitride (SiN). By means of the above process, the hard mask layer 150 of a high stress level can be deposited. The hard mask layer 150 deposited corresponding to the NMOS transistor region can protect the silicon-on-insulator layer in the NMOS transistor region in subsequent processes, while the hard mask layer 150 of a high stress level can exert a tensile stress effect on the silicon-on-insulator layer in the NMOS transistor region in subsequent processes.

Figure 4:
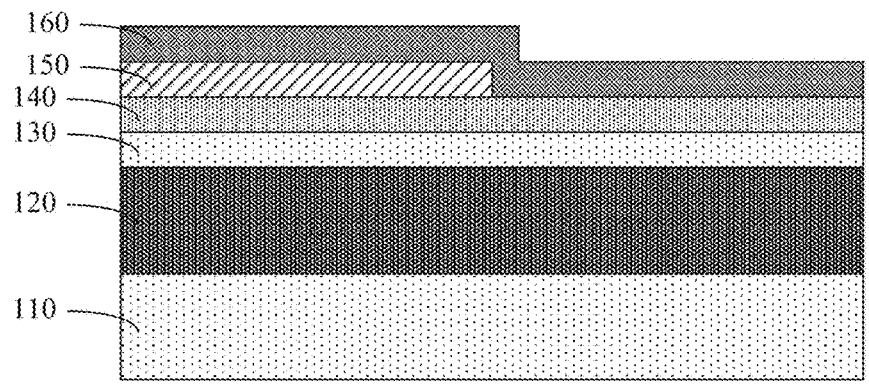

As shown in FIG. 4, an oxidation treatment is performed on the surface of an entire wafer to form a surface oxide layer 160 to cover the silicon germanium layer 140 and the hard mask layer 150. In one embodiment, a silicon oxide film is formed using reactions of oxidants with silicon atoms by means of a rapid heating process. The surface oxide layer 160 in this embodiment can prevent germanium atoms in the silicon germanium layer 140 from diffusing outwards.

Figure 5:
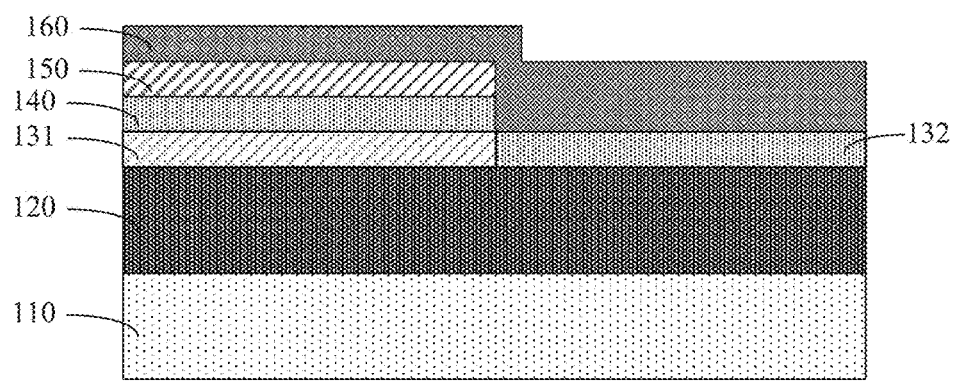

Subsequently, a high temperature annealing treatment is performed, and FIG. 5 shows a schematic structural diagram after the high temperature annealing treatment, and a portion of the silicon-on-insulator layer 130 corresponding to the NMOS transistor region in the original composite substrate is converted into a tensile stress silicon-on-insulator layer 131, and a portion corresponding to the PMOS transistor region is converted into a silicon-germanium-on-insulator layer 132.

In the above embodiments, the high temperature annealing treatment may adopt a temperature range of 800-1300° C. and a time range of 0.5-3 hours. The above-mentioned high temperature annealing treatment includes a high temperature oxidation treatment, which is also referred to as a condensation process. In the above-mentioned high temperature process, the surface oxide layer 160 can function to form silicon dioxide SiO2 using silicon atoms in the silicon germanium layer 140, and at the same time, due to the formation of silicon dioxide, germanium atoms in the silicon germanium layer 140 are pressed into the silicon-on-insulator layer, thereby converting the silicon-on-insulator layer corresponding to the PMOS region into the silicon-germanium-on-insulator layer 132. Moreover, since the germanium atoms are pressed into the silicon-on-insulator layer, compressive stress is produced in this process, which can effectively improve the hole mobility of the PMOS transistor. The silicon germanium/silicon composite layer in the PMOS transistor region is condensed and converted into a single silicon germanium layer.

As described above, due to the deposition of the hard mask layer 150 corresponding to the NMOS transistor region, the hard mask layer 150 causes the silicon atoms not to be oxidized in the silicon germanium layer 140 corresponding to the NMOS transistor region in the high temperature process, therefore, in the silicon-on-insulator layer corresponding to the NMOS transistor region, germanium atoms are not pressed. It is also due to the deposition of the hard mask layer 150 of a high stress level, in the high temperature annealing treatment, the hard mask layer 150 of the high stress level generates a tensile stress on the silicon-on-insulator layer in the NMOS transistor region to convert it into the tensile stress silicon-on-insulator layer 131.

Through the above-mentioned high temperature annealing treatment, the silicon-germanium-on-insulator layer 132 is formed on the PMOS transistor region, and the silicon-germanium-on-insulator layer 132 has compressive stress, which improves the hole mobility of the PMOS transistor. At the same time, the tensile stress silicon-on-insulator layer 131 in the NMOS transistor region having tensile stress increases the electron mobility of the NMOS transistor and effectively increases the drive current of the NMOS transistor. Thus, the performance and work function of the device can be improved by simple steps.

Thus, a subsequent transistor gate and a thin gate between the gate and the substrate will be formed on the silicon-on-insulator layer. After forming the tensile stress silicon-on-insulator layer 131 and the silicon-germanium-on-insulator layer 132, it is also necessary to remove the excess silicon germanium layer, hard mask layer and surface oxide layer formed to produce the tensile stress silicon-on-insulator layer 131 and the silicon-germanium-on-insulator layer 132.

Figure 6:
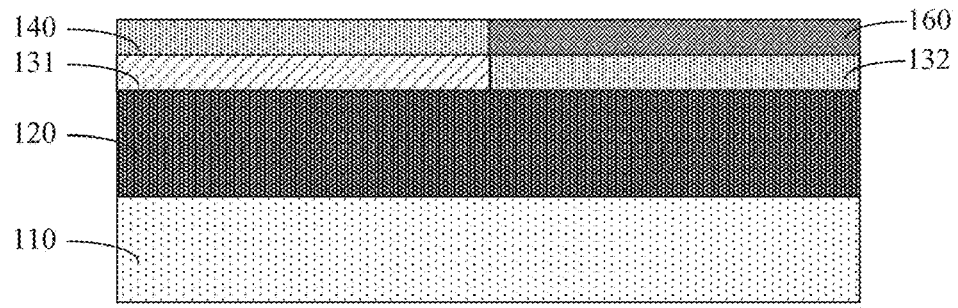
Figure 7:
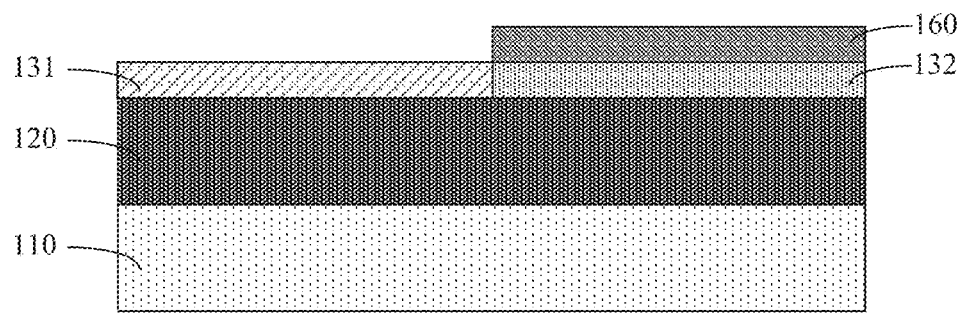
Figure 8:
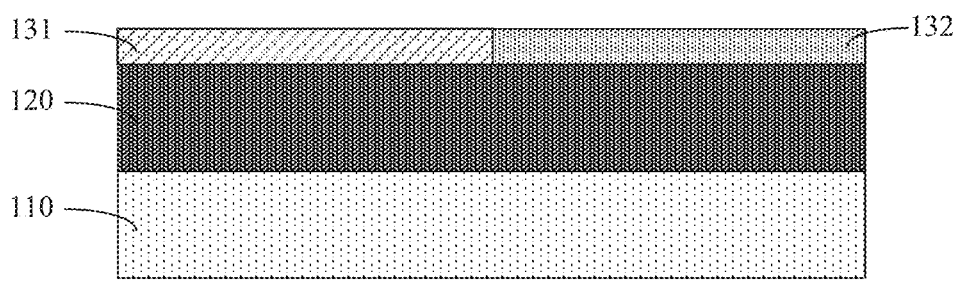

FIGS. 6-8 show the steps of removing the above-mentioned excess layers. When removing the excess layers, it is to remove the excess layers by wet etching. In one embodiment, for the difference between various materials, different removers are for reducing damages to other film layers. In the present example, the surface oxide layer 160 is removed using diluted hydrofluoric acid; the hard mask layer 150 is removed using phosphoric acid; and the silicon germanium layer 140 is removed using a mixed solution of nitric acid, hydrofluoric acid, acetic acid and water. In a further embodiment, in the above-mentioned embodiment, the concentration of the nitric acid used in the used mixed solution is 70%, the concentration of the used hydrofluoric acid is 49%, the concentration of the used acetic acid is 99.9% and the ratio of the nitric acid, the hydrofluoric acid, the acetic acid and the water is 40:1:2:57.

Figure 9:
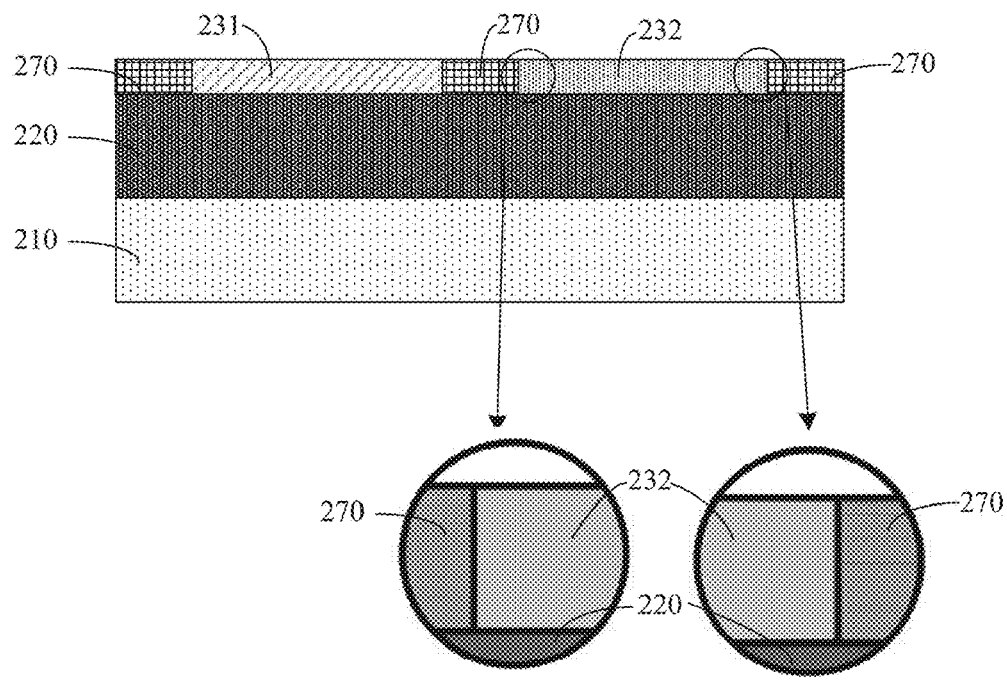
FIG. 9 shows a schematic structural diagram of a semiconductor manufactured according to another embodiment of a manufacturing method provided in the present disclosure.

In another embodiment, the method provided in the present disclosure also includes forming an STI shallow trench isolation to form active regions of PMOS transistor and NMOS transistor. FIG. 9 shows a schematic structural diagram of forming an STI shallow trench isolation 270 in abutting portions of the tensile stress silicon-on-insulator layer 231 and the silicon-germanium-on-insulator layer 232. As shown in FIG. 9, the shallow trench isolation 270 is formed in the abutting portions of the tensile stress silicon-on-insulator layer 231 and the silicon-germanium-on-insulator layer 232, and the above-mentioned tensile stress silicon-on-insulator layer 231, the silicon-germanium-on-insulator layer 232 and the STI shallow trench isolation 270 are formed on the silicon substrate layer 210 and the buried oxide layer 220.

The shallow trench isolation process in the above-mentioned embodiments includes but is not limited to shallow trench etching, oxide filling, and oxide planarization. Among these, the shallow trench etching includes but is not limited to isolating an oxide layer, depositing a nitride, performing shallow trench isolation with a mask and performing STI shallow trench etching. Among these, the STI oxide fill includes but is not limited to trench liner silicon oxide, trench CVD (chemical vapour deposition) oxide fill or PVD (physical vapour deposition) oxide fill. Among these, the planarization of the silicon surface can be implemented by means of various methods. The planarization of the silicon wafer can be implemented by using SOG (spin-on-glass) filling gaps, and the SOG can be formed of 80% solvent and 20% silicon dioxide, and after the deposition, the SOG is baked, the solvent is evaporated off, and the silicon dioxide is remained in the gaps, and it is also possible to conduct backcut of the entire surface to reduce the thickness of the entire wafer. The planarization treatment can also be effectively performed through a CMP process (also referred to as a polishing process) including, but not limited to, polishing a trench oxide (chemical mechanical polishing can be used) and removing nitride.

Since the step of forming the STI shallow trench isolation 270 in the method provided in the present disclosure follows the steps of forming the tensile stress silicon-on-insulator layer 231 and the silicon-germanium-on-insulator layer 232, therefore, there is no small interface at a boundary between the formed STI shallow trench isolation 270 and the silicon-germanium-on-insulator layer 232. As shown in an enlarged view corresponding to the edges of the STI shallow trench isolation 270 and the silicon-germanium-on-insulator layer 232 in FIG. 9, the silicon-germanium-on-insulator layer 232 provided in the present disclosure has a uniform and dense structure.

Figure 10:
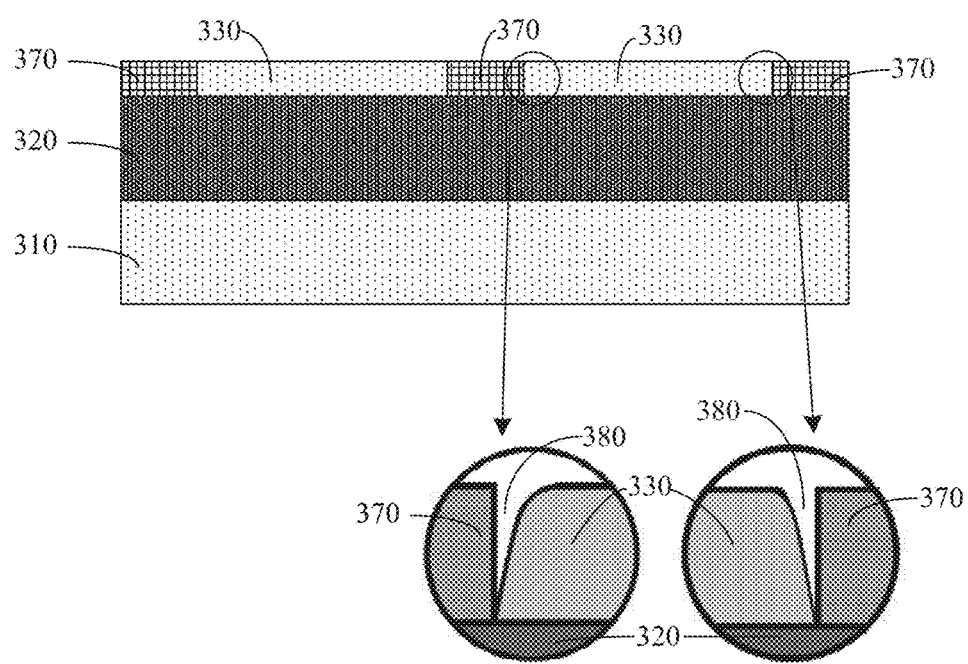
FIG. 10 shows a schematic diagram of defects in a semiconductor structure in the prior art.

FIG. 10 shows defects existing at the boundary between a silicon-on-insulator layer 330 and an STI shallow trench isolation 370 in the technique in the prior art where the STI shallow trench isolation is firstly formed. As shown in FIG. 10, the STI shallow trench isolation 370 is formed in the silicon-on-insulator layer 330, and the silicon-on-insulator layer 330 and the STI shallow trench isolation 370 are formed on the silicon substrate layer 310 and the buried oxide layer 320.

An epitaxial growth process of silicon germanium is performed after the STI shallow trench isolation 370 is formed, and the structure of a silicon germanium thin film obtained by means of this method is not uniform, and since the thermal expansion coefficients of silicon and silicon dioxide are different, a thermal process performed after the formation of the STI shallow trench isolation 370 causes silicon at the edge of the STI shallow trench isolation 370 to shrink faster than silicon dioxide inside the STI shallow trench isolation 370, therefore, it is easy to form a small interface 380 in a region near the STI shallow trench isolation 370, resulting in changes in the actual work function of the device and thus affecting the performance of the device. At the same time, during the temperature decreasing process, the silicon dioxide shrinking faster will exert a stress effect on silicon in the peripheral active region, and the conduction of the stress into the channel will lead to the decrease of hole mobility inside the PMOS, thereby affecting the performance of the device.

By means of the method provided in the present disclosure, the performance of PMOS and NMOS transistors in an FDSOI device can be simultaneously improved by means of simple process steps, and due to industrial operability, the manufactured product has reliable performance.

The present disclosure also provides a silicon-on-insulator structure having bipolar stress manufactured by the manufacturing method provided in the present disclosure, and the silicon-on-insulator structure is formed on a buried oxide layer, the buried oxide layer is formed on a silicon substrate layer, and the silicon-on-insulator structure, the buried oxide layer and the silicon substrate layer constitute a composite substrate of a transistor device, and the silicon-on-insulator structure corresponding to a P-type MOS transistor region is a silicon-germanium-on-insulator structure, and the silicon-on-insulator structure corresponding to an N-type MOS transistor region is a tensile stress silicon-on-insulator structure. The silicon-germanium-on-insulator structure has compressive stress, and the tensile stress silicon-on-insulator structure has tensile stress. The silicon-on-insulator structure provided in the present disclosure can further include an STI shallow trench isolation structure, the STI shallow trench isolation structure being located in abutting portions of the silicon-germanium-on-insulator structure and the tensile stress silicon-on-insulator structure, and the abutting portions of the silicon-germanium-on-insulator structure and the tensile stress silicon-on-insulator structure which abut the STI shallow trench isolation structure are uniform in structure.

In the silicon-on-insulator structure provided in the present disclosure, a silicon germanium thin film layer corresponding to the PMOS region is uniform and retains compressive stress remained after the annealing process, thereby improving the hole mobility of the PMOS. At the same time, the silicon-on-insulator structure corresponding to the NMOS region has tensile stress, thereby further increasing the electron mobility of the NMOS. These effectively improve the work function and performance of the device.

The present disclosure further provides a transistor comprising a transistor with the silicon-on-insulator structure as mentioned above. As stated above, the electron mobility of the N-type MOS transistor provided in the present disclosure is improved, the hole mobility of the provided P-type MOS transistor is improved, and the work function and performance of the device are effectively improved.

Therefore, the embodiments of the manufacturing method for making the silicon-on-insulator structure having bipolar stress and the silicon-on-insulator structure having bipolar stress have been described. Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a method. The appearances of phrases in various places in the specification are not necessarily all referring to a same embodiment.

What is claimed is:

1. A manufacturing method for a silicon-on-insulator structure having bipolar stress, comprising:
    providing a composite substrate, wherein the composite substrate has a silicon substrate layer, a buried oxide layer and a silicon-on-insulator layer sequentially from bottom to top;
    epitaxially growing a silicon germanium layer on an upper surface of the silicon-on-insulator layer;
    depositing a hard mask layer to cover a portion of the silicon germanium layer corresponding to an N-type MOS transistor region, wherein the hard mask layer is adapted to provide a tensile stress for the silicon-on-insulator structure;
    depositing a surface oxide layer to cover the silicon germanium layer and the hard mask layer;
    performing a high temperature annealing treatment so that a portion of the silicon-on-insulator layer corresponding to a P-type MOS transistor region is converted into a silicon-germanium-on-insulator layer, and the portion corresponding to the N-type MOS transistor region is converted into a tensile stress silicon-on-insulator layer, wherein the annealing treatment includes a high temperature oxidation treatment; and
    removing the silicon germanium layer, the hard mask layer and the surface oxide layer on the surfaces of the silicon-germanium-on-insulator layer and the tensile stress silicon-on-insulator layer.

2. The manufacturing method of claim 1, wherein the high temperature annealing treatment has a temperature range of 800-1300° C. and a time range of 0.5-3 hours.

3. The manufacturing method of claim 1, wherein the step of depositing a hard mask layer further comprises: forming the hard mask layer using a contact-etching stop-layer process by means of low-pressure chemical vapour deposition or plasma enhanced chemical vapour deposition.

4. The manufacturing method of claim 1, wherein the removing step further comprises: removing the silicon germanium layer, the hard mask layer and the surface oxide layer by using wet processes, wherein
    the surface oxide layer is removed using diluted hydrofluoric acid;
    the hard mask layer is removed using phosphoric acid; and
    the silicon germanium layer is removed using a mixed solution of nitric acid, hydrofluoric acid, acetic acid and water.

5. The manufacturing method of claim 4, wherein the mixed solution further comprises:
    the concentration of the nitric acid is 70%;
    the concentration of the hydrofluoric acid is 49%;
    the concentration of the acetic acid is 99.9%; and
    the ratio of the nitric acid, the hydrofluoric acid, the acetic acid and the water is 40:1:2:57.

6. The manufacturing method of claim 1, wherein that the method further comprises:
    forming an STI shallow trench isolation in abutting portions of the silicon-germanium-on-insulator layer and the tensile stress silicon-on-insulator layer.

* * * * *